United States Patent
Haas

(10) Patent No.: US 6,720,805 B1
(45) Date of Patent: Apr. 13, 2004

(54) OUTPUT LOAD RESISTOR BIASED LVDS OUTPUT DRIVER

(75) Inventor: David Jamie Haas, Concord, NH (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/426,140

(22) Filed: Apr. 28, 2003

(51) Int. Cl.$^7$ .................................................. H03B 1/00
(52) U.S. Cl. ....................... 327/108; 327/112; 327/563; 326/83
(58) Field of Search ................................. 327/108, 112, 327/65–67, 379, 389, 391, 170, 562, 563, 103, 307; 330/258, 259; 326/23, 24, 27, 30, 83, 86, 87

(56) References Cited

U.S. PATENT DOCUMENTS

| | | | |
|---|---|---|---|
| 5,939,904 A | * | 8/1999 | Fetterman et al. ............ 327/67 |
| 6,107,859 A | * | 8/2000 | Moyal .......................... 326/82 |
| 6,590,422 B1 | * | 7/2003 | Dillon ......................... 327/108 |
| 6,600,346 B1 | * | 7/2003 | Macaluso .................... 327/108 |

* cited by examiner

Primary Examiner—Long Nguyen
(74) Attorney, Agent, or Firm—Brett A. Hertzberg; Merchant & Gould

(57) ABSTRACT

An LVDS circuit is biased by an output load resistor. The LVDS circuit is arranged to sense the current in the output load resistor, and provide additional biasing currents to the remaining circuitry. The LVDS circuit includes a driver circuit that has common-mode feedback to control the output common-mode levels by varying a resistance associated with a variable resistor. The current through the variable resistor is reflected to a pre-driver circuit that generates the drive signals for the driver using a local supply voltage that corresponds to the output high signal level (VOH). The current through the variable resistor is also reflected to a biasing circuit that generates the local supply voltage. The LVDS circuit can be implemented as an integrated circuit that has a reduced pin count using the self-biasing method.

20 Claims, 4 Drawing Sheets

OUTPUT LOAD RESISTOR BIASED LVDS OUTPUT DRIVER

FIELD OF THE INVENTION

The present invention is related to LVDS circuits. More particularly, the present invention is related to an LVDS driver circuit that provides various biasing currents by sensing the output current in a load resistor.

BACKGROUND OF THE INVENTION

Low Voltage Differential Signaling (hereinafter referred to as LVDS) is a technology used in data transmission systems. A low voltage differential signal produced by a line driver that typically has a peak-to-peak amplitude that is in the range from 250 mV to 450 mV. The low voltage swing helps to minimize power dissipation, while maintaining high transmission speeds. Typical transmission speeds exceed 100 Mbps (Mega-bits per second).

LVDS technology is particularly useful for high-speed data transfer applications such as video data processing. LVDS technology may be found in professional video processing equipment, and consumer electronics such as camcorders and laptop computers, to name a few. Consumer electronics typically have tighter cost constraints compared to professional video processing equipment. Moreover, many consumer electronics devices have small form factor requirements based on various ergonomic considerations.

The density of circuits (board level, hybrid, and/or integrated circuit) is increasing to satisfy the need for smaller form factors. The increased density of the circuits may result in special requirements for packaging and heat dissipation. For integrated circuits, the physical size of the integrated circuit (i.e., the "die area") is often a large contributing factor in the cost.

Bonding pads are required on integrated circuits (ICs) to make each connection to external pins in the packaging material. Often times, the bonding pads on the integrated circuit (i.e., the "die") take up a substantial amount of area such that the "die-area" is said to be "pad limited". Modem technologies such as micro-SMD, and flip-chip suffer from pad limited die areas such that the number of available pins are a determining factor for the total area of the die, and hence a dominant factor in cost. The packaging costs and form factor requirements are often constrained by the pin interface requirements for the IC.

In some instances, it is impractical (either in terms of cost or feasibility) to include certain components in the integrated circuit. For example, conventional integrated circuit technology makes it impracticable to include filter capacitors in the microfarad range "on-chip". In other instances, it is desirable to keep certain components "off-chip" so that the integrated circuit can be easily configured by user selection of the component value.

BRIEF DESCRIPTION OF THE DRAWINGS

Non-limiting and non-exhaustive embodiments of the present invention are described with reference to the following drawings.

DETAILED DESCRIPTION OF THE PREFERRED EMBODIMENT

Figure 1A:
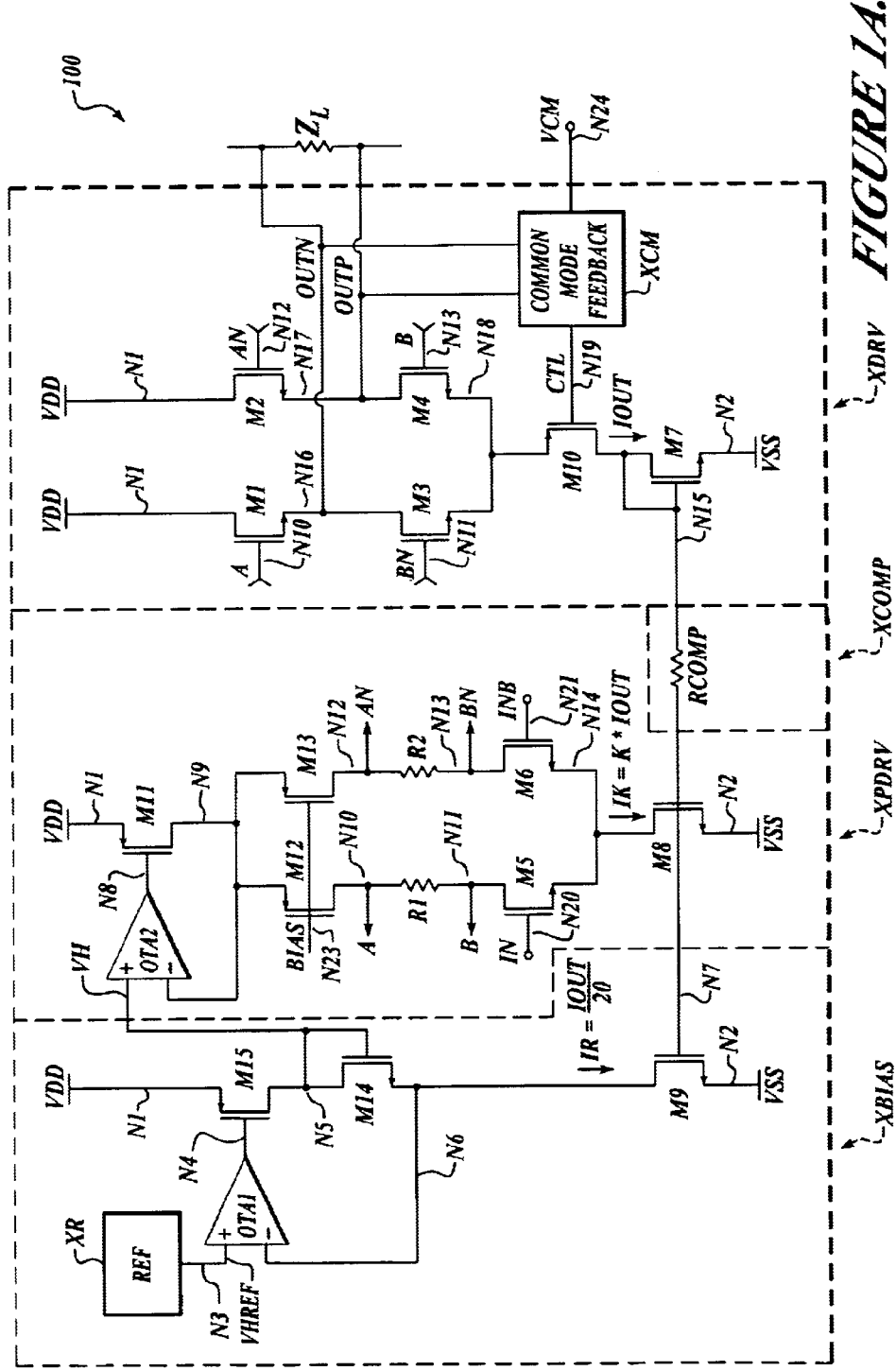
FIG. 1A is an illustration of a schematic diagram for an LVDS driver system that is arranged according to an embodiment of the present invention.

Throughout the specification and claims, the following terms take the meanings explicitly associated herein, unless the context clearly dictates otherwise. The meanings identified below are not intended to limit the terms, but merely provide illustrative examples for the terms. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected, or an indirect connection through one or more passive or active intermediary devices. The term "circuit" means either a single component or a multiplicity of components, either active and/or passive, that are coupled together to provide a desired function. The term "signal" means at least one current, voltage, charge, temperature, or data signal. Referring to the drawings, like numbers indicate like parts throughout the views.

Briefly stated, the present invention is related to an LVDS circuit is biased by an output load resistor. The LVDS circuit is arranged to sense the current in the output load resistor, and provide additional biasing currents to the remaining circuitry. The LVDS circuit includes a driver circuit that has common-mode feedback to control the output common-mode levels by varying a resistance associated with a variable resistor. The current through the variable resistor is reflected to a pre-driver circuit that generates the drive signals for the driver using a local supply voltage that corresponds to the output high signal level (VOH). The current through the variable resistor is also reflected to a biasing circuit that generates the local supply voltage. The LVDS circuit can be implemented as an integrated circuit that has a reduced pin count using the self-biasing method.

FIG. 1A is an illustration of a schematic diagram for an LVDS circuit (100) that is arranged according to an embodiment of the present invention. The circuit (100) includes a bias circuit (XBIAS), a pre-driver circuit (XPDRV), a driver circuit (XDRV), a compensation circuit (XCOMP), and a load impedance (ZL).

Bias circuit XBIAS includes a voltage reference circuit (XR), an output transconductance amplifier (OTA1), and three transistors (M9, M14, M15). Voltage reference circuit XR is coupled to node N3. Output transconductance amplifier OTA1 includes an input terminal (+) that is coupled to node N3, another input terminal (−) that is coupled to node N6, and an output terminal that is coupled to node N4. Transistor M9 includes a source that is coupled to node N2, a gate that is coupled to node N7, and a drain that is coupled to node N6. Transistor M14 includes a source that is coupled to node N6, and a gate and drain that are coupled to node N5. Transistor M15 includes a source that is coupled to node N1, a gate that is coupled to node N4, and a drain that is coupled to node N5.

Pre-driver circuit XPDRV includes an output transconductance amplifier (OTA2), two resistors (R, R2), and six transistors (M5, M6, M8, M11–M13). Output transconductance amplifier OTA2 includes an input terminal (+) that is coupled to node N5, another input terminal (−) that is coupled to node N9, and an output terminal that is coupled to node N8. Resistor R1 is coupled between nodes N10 and N11. Resistor R2 is coupled between nodes N12 and N13. Transistor M5 includes a source that is coupled to node N14, a gate that is coupled to node N20, and a drain that is coupled to node N11. Transistor M6 includes a source that is coupled to node N14, a gate that is coupled to node N21, and a drain that is coupled to node N13. Transistor M8 includes a source that is coupled to node N2, a gate that is coupled to node N7, and a drain that is coupled to node N14. Transistor M11 includes a source that is coupled to node N1, a gate that is coupled to node N8, and a drain that is coupled to node N9. Transistor M12 includes a source that is coupled to node N9, a gate that is coupled to node N23, and a drain that is coupled to node N10. Transistor M13 includes a source that is coupled to node N9, a gate that is coupled to node N23, and a drain that is coupled to node N12.

Driver circuit XDRV includes six transistors (M1–M4, M7, and M10), and a common-mode feedback circuit (XCM). Transistor M1 includes a source that is coupled to node N16, a gate that is coupled to node N10, and a drain that is coupled to node N1. Transistor M2 includes a source that is coupled to node N17, a gate that is coupled to node N12, and a drain that is coupled to node N1. Transistor M3 includes a source that is coupled to node N18, a gate that is coupled to node N11, and a drain that is coupled to node N6. Transistor M4 includes a source that is coupled to node N18, a gate that is coupled to node N13, and a drain that is coupled to node N17. Transistor M7 includes a source that is coupled to node N2 and a gate and drain that are coupled to node N15. Transistor M10 includes a source that is coupled to node N18, a gate that is coupled to node N19 and a drain that is coupled to node N15. The common mode feedback circuit includes a first input that is coupled to node N16, a second input that is coupled to node N17, a third input that is coupled to node N24 and an output that is coupled to node N19.

During operation, a high supply signal (VDD) is applied to node N1, and a low supply signal (VSS) is applied to node N2. Driver circuit XDRV is arranged to drive a current to an output load (ZL) in response to the signals A, AN, B, and BN, which are provided by pre-driver circuit XPDRV. Transistors M1 and M2 are arranged as source followers that drive currents to the output load, while transistors M3 and M4 are arranged to operate as a differential switch that provides return current paths from the output load. Transistor M10 is configured to operate as a voltage controlled resistor that is responsive to a control signal (CTL), while transistor M7 is arranged in a diode configuration. The tail current of transistors M3 and M4 is controlled by the series combination of transistors M10 and M7.

The output load converts the current into a voltage (e.g., OUTP, OUTN) that is sensed by the receiving system (not shown). The voltage has a polarity that corresponds to a logic level associated with the transmitted signal, and an offset voltage (VOS) that corresponds to the common-mode level of the output signals. When transistors M2 and M4 are active, a voltage across the load has a positive polarity with an output level corresponding to VOH. When transistors M1 and M3 are active, a voltage across the load has a negative polarity with an output level corresponding to VOL. The common-mode feedback circuit (XCM) is configured to adjust the control signal (CTL) by comparing the common-mode level (VOS) of the output signals (OUTP, OUTN) to a common-mode reference signal (VCM), such that the resistance of transistor M10 is adjusted. The resistance of transistor M10 is adjusted so that the output common-mode level (VOS) is corresponds to a desired level (e.g., 1.2V).

The tail current of transistors M3 and M4 corresponds to the current (IOUT) that is delivered to the output load (ZL). Transistor M7 is arranged in a current mirror configuration with transistor M9 such that a first scaled current (IR) is provided to the bias circuit (XBIAS). The first scaled current is scaled with respect to the output current (IOUT) by a first factor. In one example, the first scaled current (IR) is given by the expression: IR=IOUT/20. Output trans-conductance amplifier OTA1 is arranged to control the gate voltage of transistor M15 so that the voltage at nodes N3 and N6 should approximately match at steady-state. A reference voltage (VHREF) is applied to node N3 via reference circuit XR. Transistor M14 is sized as a replica of transistor M1 so that the source voltage of transistor M14 at node N6 should match VHREF. The gate voltage of transistor M14 is provided to the second trans-conductance amplifier (OTA2) as signal VH.

Transistor M8 is also arranged in a current-mirror configuration with respect to transistor M7 such that a second scaled current (IK) is provided to the pre-driver circuit (XPDRV). The second scaled current (IK) is scaled with respect to the output current (IOUT) by a second factor. In one example, the second scaled current (IK) is given by the expression: IK=K*IOUT. Output trans-conductance amplifier OTA2 is arranged to control the gate voltage of transistor M11 so that the voltage at node N9 is matched to signal VH at steady-state. The voltage at node N9 appears as a local supply for transistors M12 and M13, which are arranged as current sources. Transistors M5 and M6 are arranged as a second differential switch that is responsive to an input signal (IN) and its inverse (INB). The tail current of the second differential switch is provided by transistor M8 as the second scaled current (IK). Transistor M5 steers the tail current through resistor R1 to generate signals A and B, while transistor M6 steers the tail current through resistor R2 to generate signals AN and BN. The voltage associated with node N10 (signal A) and node N13 (signal BN) approximately corresponds to VH when transistor M5 is active and transistor M6 is inactive. The voltage associated with node N11 (signal B) and node N12 (signal AN) approximately corresponds to VH when transistor M6 is active and transistor M5 is inactive.

The scaled currents (IK, IR) provide feedback for the output current drive to the pre-driver circuit (XPDRV) and the bias circuit (XBIAS). Although each circuit block may be individually compensated for stability using traditional methods, compensation circuit XCOMP provides an additional compensation point for the circuits. Compensation circuit XCOMP is illustrated as a series resistor (RCOMP) that enhances the loop stability of the system.

Figure 1B:
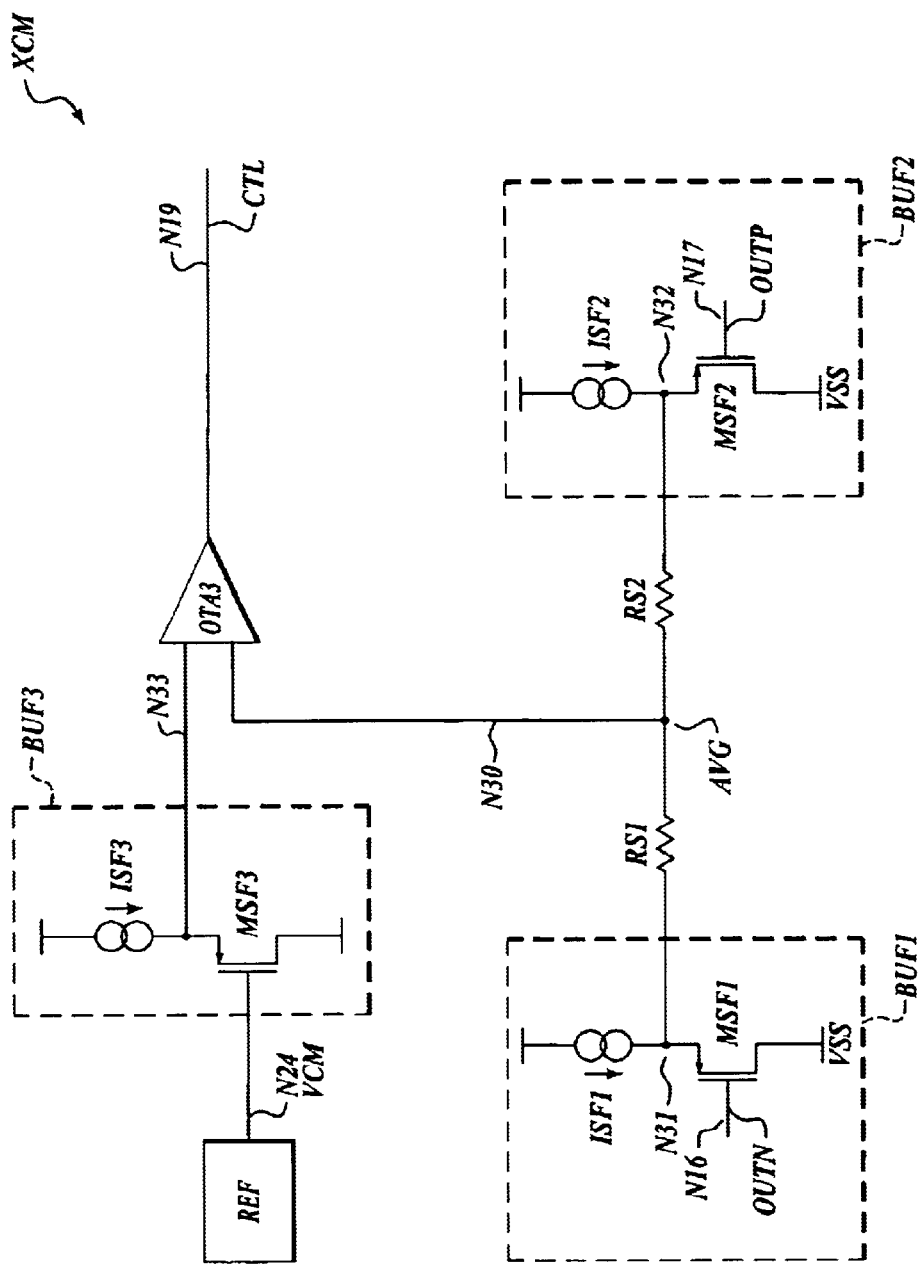
FIG. 1B is an illustration of a schematic diagram for a common-mode feedback circuit that is arranged according to an embodiment of the present invention.

FIG. 1B is an illustration of a schematic diagram for a common-mode feedback circuit (XCM) that is arranged according to an embodiment of the present invention. Common-mode feedback circuit XCM includes an output trans-conductance amplifier (OTA3), two resistors (RS1–RS2), and three buffers (BUF1–BUF3).

Buffer BUF1 includes an input that is coupled to node N16, and an output that is coupled to node N31. Buffer BUF2 includes an input that is coupled to node N17 and an output that is coupled to node N32. Buffer BUF3 includes an input that is coupled to node N24, and an output that is coupled to node N33. Resistor RS1 is coupled between nodes N30 and N31, while resistor RS2 is coupled between nodes N30 and N32. Output trans-conductance amplifier OTA3 includes inputs that are coupled to nodes N30 and N33, and an output that is coupled to node N19.

In operation a common-mode reference signal (VCM) is coupled to node N24, while output signals OUTP and OUTN are coupled to nodes N17 and N16, respectively. The outputs of buffers BUF1 and BUF2 are arranged to cooperate with resistors RS1 and RS2 to provide an average signal (AVG) at node N30. The output trans-conductance amplifier (OTA3) is configured to adjust the control signal (CTL) at node N19 by comparing the average signal (AVG) to the buffered reference signal at node N33. Buffers BUF1–BUF3 are illustrated as source followers that include at least one p-type MOS transistor (MSF1–MSF3) and a current source (ISF1–ISF3). Buffer BUF3 is matched to buffers BUF1 and BUF2 so that various characteristics of the buffers (e.g., process, supply, and temperature based variations in performance) are matched to all input of the output trans-conductance amplifier (OTA3).

Figure 2:
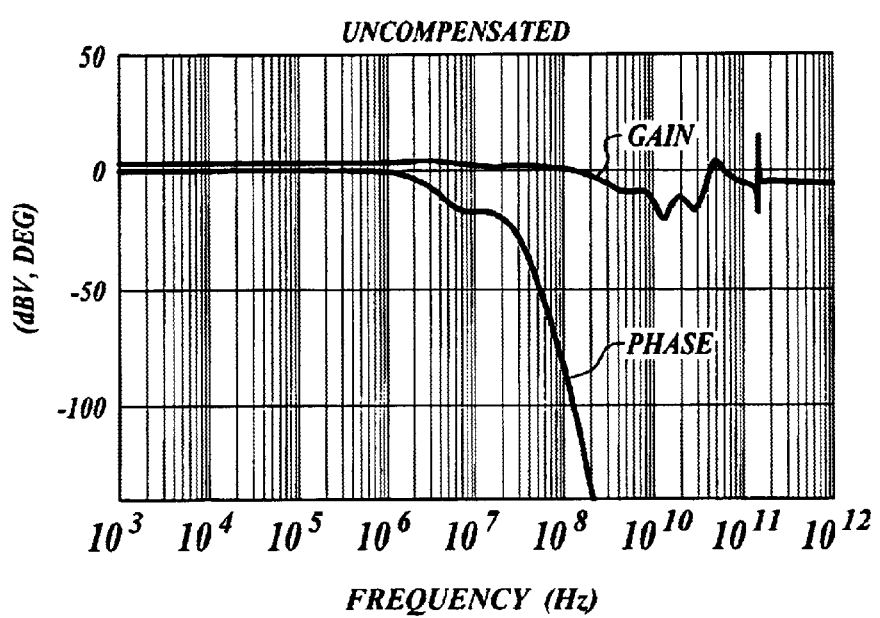
FIG. 2 is an illustration of a stability graph for an LVDS driver system that is arranged according to an embodiment of the present invention.
Figure 3:
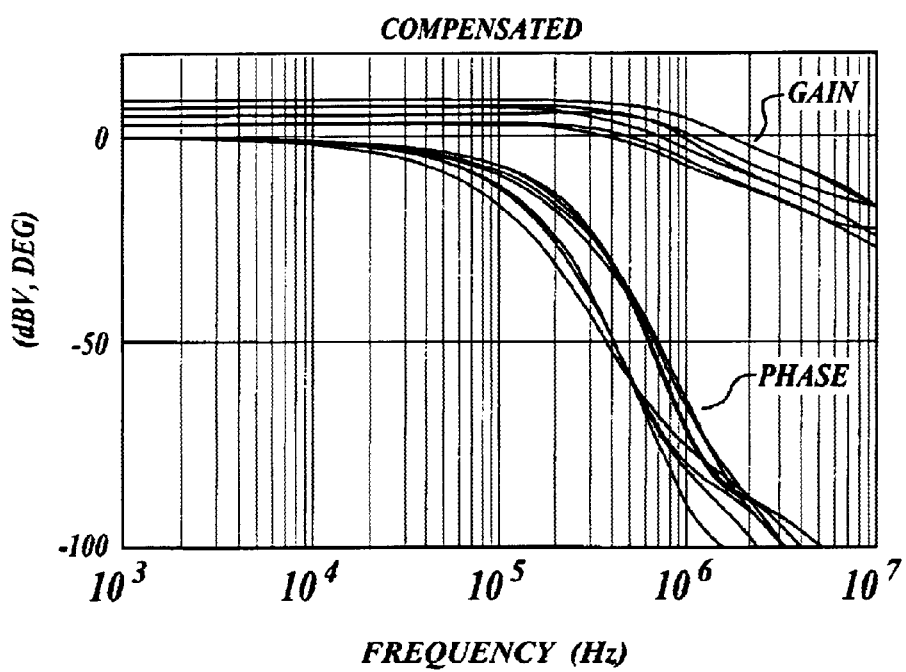
FIG. 3 is an illustration of another stability graph for an LVDS driver system that is arranged according to an embodiment of the present invention.

FIG. 2 is an illustration of a stability graph for an uncompensated LVDS driver system that is arranged according to an embodiment of the present invention. FIG. 3 is an illustration of another stability graph for a compensated LVDS driver system that is arranged according to an embodiment of the present invention. The gain/phase response of the system loop is unpredictable at higher frequencies as shown in FIG. 2. The addition of series resistor RCOMP is illustrated in FIG. 3. The gain/phase response of the system loop is shown in FIG. 3 as very stable over all process, voltage, and temperature corners.

The circuit arrangement illustrated in FIG. 2 is a self-biased circuit that uses the differential load resistor as a reference to bias the circuitry. A typical LVDS system has an output load with an impedance of 100 Ω, where the output load impedance is maintained with a tolerance of ±5% or less. The self-biased circuit may be used in an IC solution without requiring additional pins in the IC package for the biasing elements. Moreover, the self-biasing arrangement will provide bias currents with better performance and reduced tolerances since the load impedance is maintained with a tolerance of ±5% or less.

The above specification, examples and data provide a complete description of the manufacture and use of the composition of the invention. Since many embodiments of the invention can be made without departing from the spirit and scope of the invention, the invention resides in the claims hereinafter appended.

I claim:

1. An apparatus that is arranged to drive a load resistance, comprising:
    a driver circuit that is arranged to drive an output current to the load resistance in response to drive signals such that an output signal is provided across the load;
    a pre-driver circuit that is arranged to provide drive signals in response to an input signal;
    a bias circuit that is arranged to provide a local reference voltage supply to the pre-driver circuit, wherein the local reference voltage supply has a voltage that is related to a high output voltage level, wherein the high output voltage level is associated with the output signal;
    a first current mirror device that is arranged to supply a biasing current to the pre-driver circuit in response to the output current; and
    a second current mirror device that is arranged to supply another biasing current to the bias circuit in response to the output current, whereby the apparatus is self-biased using the load resistance as reference.

2. The apparatus of claim 1,
    wherein the driver circuit comprises a first transistor that is arranged to sense the output current;
    wherein the first current mirror device comprises a second transistor that is arranged to provide the biasing current in response to the output current such that the biasing current is scaled relative to the output current as a first scaled current; and
    wherein the second current mirror device comprises a third transistor that is arranged to provide the another biasing current in response to the output current such that the another biasing current is scaled relative to the output current as a second scaled current.

3. The apparatus of claim 2, further comprising a resistor that includes a first port and a second port, wherein the first port is coupled to the gate of the first transistor, and wherein the second port is coupled to the gates of the second and third transistors.

4. The apparatus of claim 1, wherein the driver circuit comprises an H-bridge circuit that is responsive to the drive signals.

5. The apparatus of claim 4, wherein the driver circuit further comprises a voltage controlled resistor circuit and a common-mode-feedback circuit, wherein the voltage controlled resistor circuit is coupled to the load resistance through the H-bridge circuit, and wherein the common-mode feedback circuit is configured to control a resistance that is associated with the voltage controlled resistor circuit in response to a common-mode voltage that is associated with the output signal.

6. The apparatus of claim 5, wherein the comnmon-mode-feedback circuit comprises: a first buffer circuit that is arranged to provide a first buffered signal in response to a first portion of the output signal, a second buffer circuit that is arranged to provide a second buffered signal in response to a second portion of the output signal, a resistance circuit that is arranged to provide an average signal in response to the first and second buffered signals, and an output trans-conductance amplifier that is arranged to adjust the a resistance that is associated with the voltage controlled resistor circuit in response to the average signal and a reference signal.

7. The apparatus of claim 6, wherein the first and second buffer circuits are source follower circuits.

8. The apparatus of claim 6, wherein the common-mode feedback circuit further comprises a third buffer circuit that is arranged to provide a buffered reference signal in response to the reference signal, wherein the buffered reference signal is coupled to an input of the output trans-conductance amplifier, and wherein the first, second, and third buffer circuits are source follower circuits.

9. An LVDS driver circuit that is arranged to drive a load resistance, comprising:
    a first transistor, wherein the first transistor includes a first drain that is coupled to a first power node, a first gate that is coupled to a first signal node for receiving a first signal and a first source that is coupled to a first output node;
    a second transistor, wherein the second transistor includes a second drain that is coupled to the first power node, a second gate that is coupled to a first inverse signal node for receiving a second signal that is complementary to the first signal and a second source that is coupled to a second output node, wherein the load resistance is coupled between the first and second output nodes;

a third transistor, wherein the third transistor includes a third drain that is coupled to the first output node, a third gate that is coupled to a second inverse signal node for receiving a third signal, and a third source that is coupled to a first common node;

a fourth transistor, wherein the fourth transistor includes a fourth drain that is coupled to the second output node, a fourth gate that is coupled to a second signal node for receiving a fourth signal that is complementary to the third signal, and a fourth source that is coupled to the first common node;

a common-mode feedback circuit, wherein the common-mode feedback circuit includes a first input that is coupled to the first output node, a second input that is coupled to the second output node, a third input that is coupled to a common-mode reference node, and an output that is coupled to a first control node; and a voltage controlled resistor circuit, wherein the voltage controlled resistor circuit is coupled between the first common node and a second power node, and wherein the voltage controlled resistor circuit includes a control input that is coupled to the first control node.

10. The LVDS driver circuit of claim 9, the voltage controlled resistor circuit comprising:

a fifth transistor, wherein the fifth transistor includes a fifth drain that is coupled to a first intermediary node, a fifth gate that is coupled to the first control node, and a fifth source that is coupled to the first common node; and a sixth transistor, wherein the sixth transistor includes a sixth drain that is coupled to the first intermediary node, a sixth gate that is coupled to the first intermediary node, and a sixth source that is coupled to the second power node.

11. The LVDS driver circuit of claim 10, further comprising:

a seventh transistor, wherein the seventh transistor includes a seventh drain that is coupled to a second common node, a seventh gate that is coupled to the first intermediary node, and a seventh source that is coupled to the second power node;

an eighth transistor, wherein the eighth transistor includes an eighth drain that is coupled to the second signal node, an eighth gate that is coupled to an input node, and an eighth source that is coupled to the second comnmon node; and an ninth transistor, wherein the ninth transistor includes a ninth drain that is coupled to the second inverse signal node, a ninth gate that is coupled to an inverse input node, and an eighth source that is coupled to the second common node.

12. The LVDS driver circuit of claim 11, further comprising:

a first resistor that is coupled between the first signal node and the second signal node;

a second resistor that is coupled between the first inverse signal node and the second inverse signal node;

a first current source that is coupled between a local supply node and the first signal node; and a second current source that is coupled between the local supply node and the first inverse signal node.

13. The LVDS driver circuit of claim 10 further comprising:

a seventh transistor, wherein the seventh transistor includes a seventh drain that is coupled to a second intermediary node, a seventh gate that is coupled to the first intermediary node, and a seventh source that is coupled to the second power node;

an eighth transistor, wherein the eighth transistor includes an eighth drain that is coupled to a high reference node, an eighth gate that is coupled to the high reference node, and an eighth source that is coupled to the second intermediate node;

a ninth transistor, wherein the ninth transistor includes an ninth drain that is coupled to the high reference node, a ninth gate that is coupled to a second control node, and a ninth source that is coupled to the first power supply node; and a trans-conductance amplifier that includes a non-inverting input that is coupled to a reference node, an inverting input that is coupled to the second intermediary node, and an output that is coupled to the second control node.

14. The LVDS driver circuit of claim 13 further comprising:

a trans-conductance amplifier that includes a non-inverting input that is coupled to the high reference node, an inverting input that is coupled to a local supply node, and an output that is coupled to a third control node; and a tenth transistor, wherein the tenth transistor includes a tenth drain that is coupled to the local supply node, a tenth gate that is coupled to the third control node, and a tenth source that is coupled to the first power supply node.

15. The LVDS driver circuit of claim 14 further comprising:

an eleventh transistor, wherein the eleventh transistor includes an eleventh drain that is coupled to a second common node, an eleventh gate that is coupled to the first intermediary node, and an eleventh source that is coupled to the second power node;

a twelfth transistor, wherein the twelfth transistor includes a twelfth drain that is coupled to the second signal node, a twelfth gate that is coupled to an input node, and a twelfth source that is coupled to the second common node;

a thirteenth transistor, wherein the thirteenth transistor includes a thirteenth drain that is coupled to the second inverse signal node, a thirteenth gate that is coupled to an inverse input node, and a thirteenth source that is coupled to the second common node;

a first resistor that is coupled between the first signal node and the second signal node;

a second resistor that is coupled between the first inverse signal node and the second inverse signal node;

a first current source that is coupled between the local supply node and the first signal node; and a second current source that is coupled between the local supply node and the first inverse signal node.

16. The LVDS driver circuit of claim 15 wherein the gates of the sixth and eleventh transistors are coupled to the first intermediary node through a compensation circuit.

17. The LVDS driver circuit of claim 15 wherein the compensation circuit is a resistor.

18. An apparatus that is arranged to drive a load resistance, comprising:

a driver means, wherein the driver means is arranged to drive an output current to the load resistance in response to drive signals such that an output signal is provided across the load;

a pre-driver means that is arranged to provide drive signals in response to an input signal;

a local supply means that is arranged to provide a local reference voltage supply to the pre-driver means, wherein the local reference voltage supply has a voltage that is related to a high output voltage level, wherein the high output voltage level is associated with the output signal;

a current sense means, wherein the current sense means is configured to sense the output current and provide a sense signal;

a first scaled current means, wherein the first scaled current means is arranged to provide a first scaled current to the local supply means in response to the sense signal such that the first scaled current is scaled relative to the output current; and a second scaled current means, wherein the second scaled current means is arranged to provide a second scaled current to the pre-driver means in response to the sense signal such that the second scaled current is scaled relative to the output current.

19. The apparatus of claim 18 further comprising a compensation means, wherein the compensation means is coupled between the sense signal and the first and second scaled current means.

20. The apparatus of claim 18 further comprising a voltage controlled resistor means and a common-mode control means, wherein the voltage controlled resistor means is coupled to the load resistance, and wherein the common-mode control means is configured to control a resistance that is associated with the voltage controlled resistor means in response to a common-mode voltage that is associated with the output signal.

* * * * *

UNITED STATES PATENT AND TRADEMARK OFFICE
CERTIFICATE OF CORRECTION

PATENT NO.     : 6,720,805 B1
DATED          : April 13, 2004
INVENTOR(S)    : David Jamie Haas It is certified that error appears in the above-identified patent and that said Letters Patent is hereby corrected as shown below:

Column 1,
Line 41, "Modem technologies" should read -- Modern technologies --

Column 2,
Line 65, "(R, R2)" should read -- (R1, R2) --

Column 6,
Line 40, "adjust the a resistance" should read -- adjust the resistance --
Lines 58 and 64, "signal and" should read -- signal, and --

Signed and Sealed this

Twenty-eighth Day of December, 2004

JON W. DUDAS
*Director of the United States Patent and Trademark Office*